US008986495B2

(12) United States Patent
Iizuka

(10) Patent No.: US 8,986,495 B2
(45) Date of Patent: *Mar. 24, 2015

(54) PLASMA PROCESSING APPARATUS

(75) Inventor: Hachishiro Iizuka, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 473 days.

This patent is subject to a terminal disclaimer.

(21) Appl. No.: 12/958,853

(22) Filed: Dec. 2, 2010

(65) Prior Publication Data

US 2011/0132542 A1 Jun. 9, 2011

Related U.S. Application Data

(60) Provisional application No. 61/296,290, filed on Jan. 19, 2010.

(30) Foreign Application Priority Data

Dec. 3, 2009 (JP) ................................. 2009-275564

(51) Int. Cl.
C23F 1/08 (2006.01)
C23C 16/455 (2006.01)
(Continued)

(52) U.S. Cl.
CPC ....... *H01J 37/32623* (2013.01); *H01J 37/3244* (2013.01); *C23C 16/45563* (2013.01); *C23C 16/4558* (2013.01); *H01J 37/32091* (2013.01);
(Continued)

(58) Field of Classification Search
None
See application file for complete search history.

(56) References Cited

U.S. PATENT DOCUMENTS 4,294,194 A * 10/1981 Behn et al. .................... 118/719
4,340,462 A * 7/1982 Koch ......................... 156/345.47
4,590,042 A * 5/1986 Drage ....................... 156/345.34
(Continued)

FOREIGN PATENT DOCUMENTS

JP H05-082044 U 11/1993
JP 06244123 9/1994
(Continued)

OTHER PUBLICATIONS

D.V. Mahindru et al., "Protective Treatment of Aluminum and its Alloys," Global Journal of Research in Engineering, vol. 11, Issue 3, Version 1.0 Apr. 2011 pp. 11-14 (2011).*
(Continued)

*Primary Examiner* — Jeffrie R Lund
*Assistant Examiner* — Stanislav Antolin
(74) *Attorney, Agent, or Firm* — Pearne & Gordon LLP

(57) ABSTRACT

A plasma processing apparatus includes an upper electrode that is installed within a processing chamber so as to face a lower electrode, supplies a gas through a plurality of gas supply holes provided in a facing surface and is vertically movable; a cover body installed above the upper electrode so as to airtightly seal a top opening of the processing chamber; a multiple number of gas exhaust holes provided in the facing surface; a ring-shaped member that is arranged along a circumference of the upper electrode, is vertically movable along with the upper electrode, and forms, at a lowered position, a processing space surrounded by the lower electrode, the upper electrode and the ring-shaped member; a multiplicity of gas supply holes opened in an inner wall of the ring-shaped member; and a plurality of gas exhaust holes opened in an inner wall of the ring-shaped member.

5 Claims, 4 Drawing Sheets

(51) Int. Cl.
*H01L 21/67* (2006.01)
*H01J 37/32* (2006.01)

(52) U.S. Cl.
CPC ....... *H01J 37/32568* (2013.01); *H01L 21/6719* (2013.01)
USPC .................. 156/345.33; 118/715; 118/723 R; 118/723 E; 156/345.47; 156/345.34; 156/345.43

(56) References Cited

U.S. PATENT DOCUMENTS

| | | | | |
|---|---|---|---|---|
| 4,952,299 | A * | 8/1990 | Chrisos et al. | 118/715 |
| 4,987,856 | A * | 1/1991 | Hey et al. | 118/723 E |
| 4,994,301 | A * | 2/1991 | Kusumoto et al. | 427/586 |
| 5,102,523 | A * | 4/1992 | Beisswenger et al. | 118/723 E |
| 5,110,437 | A * | 5/1992 | Yamada et al. | 118/723 E |
| 5,273,588 | A * | 12/1993 | Foster et al. | 118/723 E |
| 5,540,772 | A * | 7/1996 | McMillan et al. | 118/50 |
| 5,704,981 | A * | 1/1998 | Kawakami et al. | 118/715 |
| 5,851,589 | A * | 12/1998 | Nakayama et al. | 427/248.1 |
| 5,997,650 | A * | 12/1999 | Herlinger et al. | 118/724 |
| 6,008,130 | A * | 12/1999 | Henderson et al. | 438/710 |
| 6,156,151 | A * | 12/2000 | Komino et al. | 156/345.29 |
| 6,537,418 | B1 * | 3/2003 | Muller et al. | 156/345.34 |
| 6,666,920 | B1 * | 12/2003 | Sillmon et al. | 118/715 |
| 7,737,035 | B1 | 6/2010 | Lind et al. | 438/680 |
| 8,366,828 | B2 | 2/2013 | Iizuka | 118/715 |
| 8,518,210 | B2 * | 8/2013 | Smargiassi et al. | 156/345.33 |
| 8,852,386 | B2 * | 10/2014 | Iizuka et al. | 156/345.34 |
| 2001/0003271 | A1 * | 6/2001 | Otsuki | 118/723.001 |
| 2002/0002948 | A1 * | 1/2002 | Hongo et al. | 118/723 R |
| 2002/0170881 | A1 * | 11/2002 | Benzing et al. | 216/67 |
| 2003/0029568 | A1 * | 2/2003 | Brown et al. | 156/345.51 |
| 2003/0075273 | A1 * | 4/2003 | Kilpela et al. | 156/345.33 |
| 2003/0209324 | A1 * | 11/2003 | Fink | 156/345.48 |
| 2004/0050496 | A1 * | 3/2004 | Iwai et al. | 156/345.51 |
| 2004/0089238 | A1 * | 5/2004 | Birnbaum et al. | 118/724 |
| 2004/0149214 | A1 * | 8/2004 | Hirose et al. | 118/715 |
| 2004/0182515 | A1 * | 9/2004 | Sato | 156/345.43 |
| 2004/0221808 | A1 * | 11/2004 | Kawano | 118/715 |
| 2005/0106319 | A1 * | 5/2005 | Jurgensen et al. | 118/715 |
| 2005/0133159 | A1 * | 6/2005 | Johnsgard et al. | 156/345.33 |
| 2005/0229848 | A1 * | 10/2005 | Shinriki et al. | 118/715 |
| 2006/0001848 | A1 * | 1/2006 | Hwang | 355/30 |
| 2006/0234514 | A1 * | 10/2006 | Gianoulakis et al. | 118/715 |
| 2006/0286775 | A1 * | 12/2006 | Singh et al. | 438/478 |
| 2007/0209589 | A1 * | 9/2007 | Liu | 118/715 |
| 2007/0277734 | A1 * | 12/2007 | Lubomirsky et al. | 118/715 |
| 2007/0298362 | A1 * | 12/2007 | Rocha-Alvarez et al. | 432/9 |
| 2008/0295771 | A1 * | 12/2008 | Chiang et al. | 118/715 |
| 2009/0148704 | A1 * | 6/2009 | Takasuka et al. | 118/715 |
| 2009/0304924 | A1 * | 12/2009 | Gadgil | 427/255.5 |
| 2011/0061813 | A1 * | 3/2011 | Iizuka et al. | 156/345.34 |
| 2011/0284165 | A1 * | 11/2011 | Iizuka | 156/345.34 |

FOREIGN PATENT DOCUMENTS

| | | | |
|---|---|---|---|
| JP | H11-054496 A | | 2/1999 |
| JP | 2002184761 A | * | 6/2002 |
| JP | 2005093843 | | 4/2005 |
| JP | 2006344701 | | 12/2006 |
| JP | 2007-525021 A | | 8/2007 |
| WO | WO 0249088 A1 | * | 6/2002 |
| WO | 2005/052998 A2 | | 6/2005 |
| WO | 2008/088668 A1 | | 7/2008 |
| WO | WO 2009091189 A2 | * | 7/2009 ............ H01L 21/687 |
| WO | WO 2010041213 A1 | * | 4/2010 ............ C23C 16/455 |

OTHER PUBLICATIONS

D.A. Scola, "Polyimide Resins," ASM Handbook, vol. 21: Composites, D.B. Miracle and S.L. Donaldson, editors, pp. 105-119 (2001).*

* cited by examiner

PLASMA PROCESSING APPARATUS

CROSS-REFERENCE TO RELATED APPLICATION

This application claims the benefit of Japanese Patent Application No. 2009-275564 filed on Dec. 3, 2009, and U.S. Provisional Application Ser. No. 61/296,290 filed on Jan. 19, 2010, the entire disclosures of which are incorporated herein by reference.

FIELD OF THE INVENTION

The present disclosure relates to a plasma processing apparatus.

BACKGROUND OF THE INVENTION

In the field of manufacture of a semiconductor device or the like, a shower head for supplying a gas toward a substrate such as a semiconductor wafer in a shower pattern has been conventionally used. To be specific, in a plasma processing apparatus that performs a plasma etching process on a substrate such as a semiconductor wafer, a mounting table for mounting the substrate thereon is installed in a processing chamber, and the shower head is installed so as to face the mounting table. The shower head is provided with a multiple number of gas discharge holes on its surface facing the mounting table, and a gas is supplied toward the substrate through the gas discharge holes in a shower pattern.

As the above-mentioned plasma processing apparatus, there is known a configuration in which a gas is exhausted downward from the vicinity of the mounting table so as to uniform a gas flow within the processing chamber. Further, in order to enhance uniformity of a plasma process in the surface, there is also known a plasma processing apparatus including a gas discharge unit for supplying a gas toward a periphery of a substrate on a mounting table in addition to the shower head (see, for example, Patent Document 1). Moreover, there is also known a plasma processing apparatus having a configuration in which a gas is upwardly exhausted toward an upper side of a processing chamber from the vicinity of a shower head (see, for example, Patent Document 2). Further, there is also known a plasma processing apparatus having a configuration in which a shower head serving as an upper electrode is vertically movable, and, thus, a distance between the shower head and a mounting table serving as a lower electrode is variable (see, for example, Patent Document 3).

Patent Document 1: Japanese Patent Laid-open Publication No. 2006-344701
Patent Document 2: Japanese Patent No. 2662365
Patent Document 3: Japanese Patent Laid-open Publication No. 2005-093843

In the prior art as stated above, the plasma processing apparatuses are configured to exhaust a gas toward a lower side of the processing chamber from the vicinity of the mounting table (substrate) or to exhaust a gas toward an upper side of the processing chamber from the vicinity of the shower head. Accordingly, a gas supplied from the shower head flows from a center of the substrate to the periphery thereof. Such a gas flow may cause a difference in processing states of the center and the periphery of the substrate, resulting in deterioration of process uniformity in the surface. Furthermore, since a gas exhaust path needs to be provided in the vicinity of the mounting table (substrate) or in the vicinity of the shower head, an internal volume of the processing chamber may become much larger than the size of the substrate to be accommodated therein. Thus, unnecessary space may increase, which may hinder miniaturization of the entire apparatus.

Further, in a capacitively coupled plasma processing apparatus in which a shower head and a mounting table function as an upper electrode and a lower electrode, respectively, a distance between the upper electrode (shower head) and the lower electrode (mounting table) needs to be variable. However, since the inside of a processing chamber is turned into a depressurized atmosphere, a great force is required for a driving mechanism to move the upper electrode (shower head) or the lower electrode (mounting table) up and down against a pressure difference between the inside and the outside of the processing chamber, and, thus, a great amount of energy is required for the driving.

BRIEF SUMMARY OF THE INVENTION

In view of the foregoing, the present disclosure provides a plasma processing apparatus capable of improving process uniformity in wafer surface, and reducing the size of the apparatus by reducing unnecessary space within a processing chamber and also capable of easily varying a distance between an upper electrode and a lower electrode, as compared to conventional cases.

In accordance with one aspect of the present disclosure, there is provided a plasma processing apparatus including: a lower electrode installed within a processing chamber and serving as a mounting table that mounts a substrate thereon; an upper electrode that is installed within the processing chamber so as to face the lower electrode and is vertically movable so as to vary a distance between the upper electrode and the lower electrode, the upper electrode serving as a shower head for supplying a gas toward the substrate in a shower pattern through a plurality of gas supply holes provided in a facing surface of the upper electrode facing the lower electrode; a cover body installed above the upper electrode so as to airtightly seal a top opening of the processing chamber; a multiple number of gas exhaust holes provided in the facing surface; a ring-shaped member that is protruded downward and arranged along a circumference of the upper electrode, is vertically movable along with the upper electrode, and forms, at a lowered position, a processing space surrounded by the lower electrode, the upper electrode and the ring-shaped member; a multiplicity of gas supply holes opened in an inner wall of the ring-shaped member to supply a gas into the processing space; and a plurality of gas exhaust holes opened in an inner wall of the ring-shaped member to evacuate the processing space.

In accordance with the present disclosure, it is possible to provide the plasma processing apparatus capable of improving process uniformity in the wafer surface, and reducing the size of the apparatus by reducing unnecessary space within the processing chamber and also capable of easily varying the distance between the upper electrode and the lower electrode, as compared to conventional cases.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, embodiments of the present disclosure will be described in detail with reference to the accompanying drawings.

Figure 1:
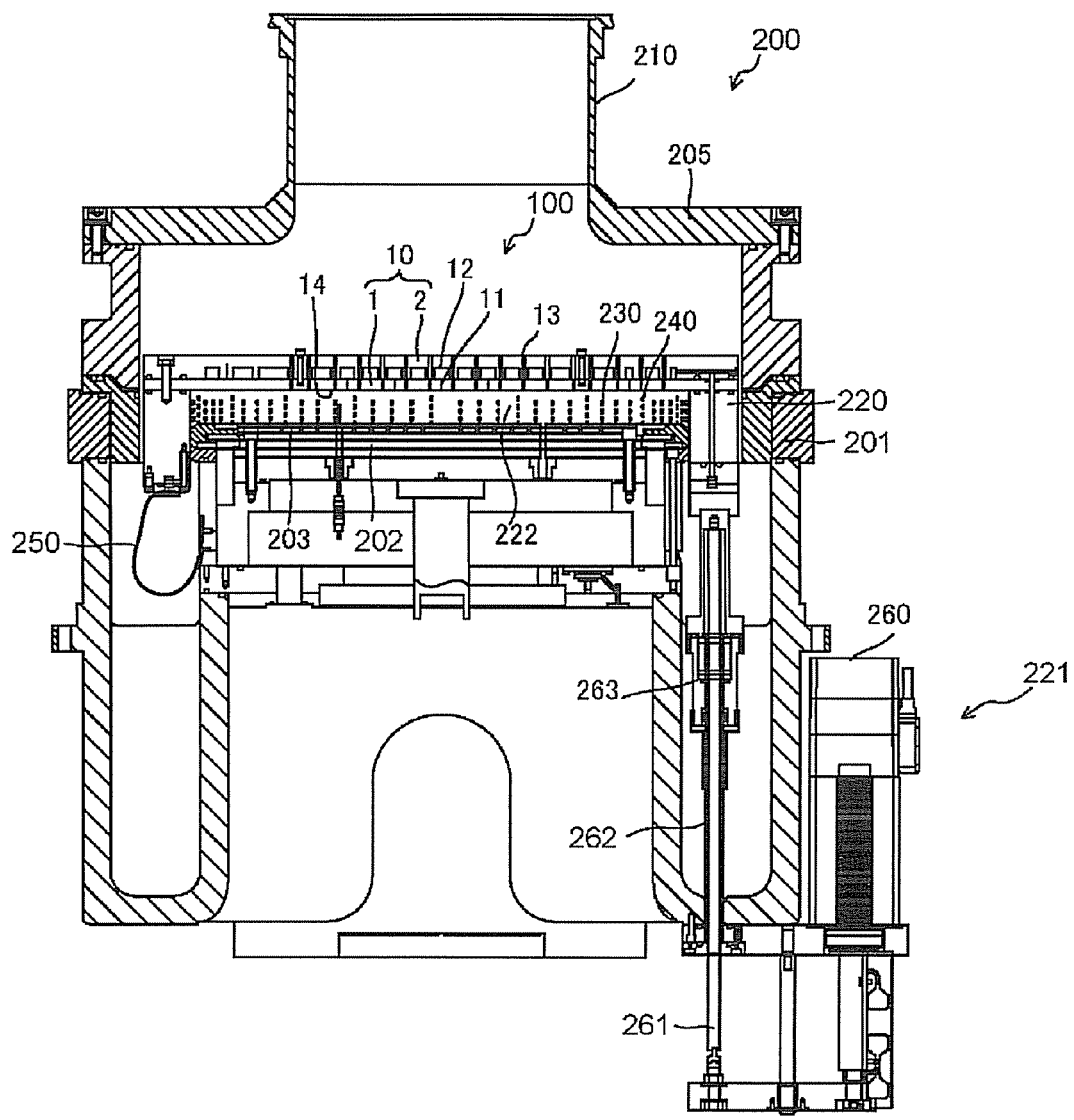
FIG. 1 is a longitudinal cross sectional view of a plasma processing apparatus in accordance with an embodiment of the present disclosure.
Figure 2:
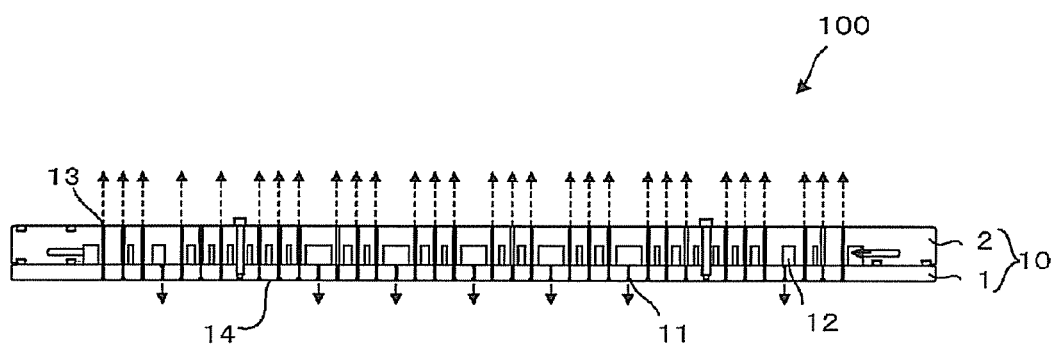
FIG. 2 is an enlarged longitudinal cross sectional view showing major parts of the plasma processing apparatus of FIG. 1.

FIG. 1 is a schematic view illustrating a cross sectional configuration of a plasma etching apparatus 200 as a plasma processing apparatus in accordance with an embodiment of the present disclosure. FIG. 2 is a cross sectional view showing a schematic configuration of a shower head 100 of the plasma etching apparatus 200. The plasma etching apparatus 200 is configured as a plasma etching apparatus of a capacitively coupled parallel plate type in which upper and lower electrode plates are arranged in parallel to each other and are connected to power supplies (not shown) for plasma generation.

As illustrated in FIG. 2, the shower head 100 is made up of a layered body 10 having two sheets of plate-shaped members: a lower member 1 and an upper member 2 placed on the top of the lower member 1. By way of example, the lower member 1 and the upper member 2 are made of aluminum of which surface is anodically oxidized. As shown in FIG. 1, the shower head 100 is installed in a processing chamber 201 of the plasma etching apparatus 200 so as to face a mounting table 202 that mounts a semiconductor wafer (substrate) thereon. That is, the lower member 1 shown in FIG. 2 is installed to serve as a surface 14 facing the mounting table 202 shown in FIG. 1.

In the layered body 10, the lower member 1 having the surface 14 facing the mounting table 202 is provided with a multiple number of gas discharge holes 11, and a gas flow path 12 communicating with the gas discharge holes 11 is formed between the lower member 1 and the upper member 2. The gas discharge holes 11 are configured to supply a gas toward the substrate (lower side of FIG. 2) in a shower pattern, as indicated by arrows in FIG. 2. Further, a gas inlet (not shown) through which the gas is introduced into the gas flow path 12 is provided in a peripheral portion of the layered body 10.

Further, a multiplicity of gas exhaust holes 13 are formed through the layered body 10, i.e., through the lower member 1 and the upper member 2. The gas exhaust holes 13 serve as a gas exhaust mechanism that performs evacuation so as to allow the gas to flow from a substrate side (lower side of FIG. 2) toward an opposite side of the substrate (upper side of FIG. 2), as indicated by dotted-line arrows in FIG. 2.

By way of example, each gas exhaust hole 13 has a diameter of about 1.2 mm. The gas exhaust holes 13 are uniformly distributed over the entire region of the shower head 100 except its peripheral portion (which will be function as a fixing part to which a ring-shaped member 220 to be described later is fixed). For example, in case that the shower head 100 is designed to process a semiconductor wafer having a diameter of about 12 inches (about 300 mm), the number of the gas exhaust holes 13 may be about 2000 to about 2500. The shape of the gas exhaust holes 13 may not be limited to a circular shape, but they may have other shapes such as an elliptic shape. The gas exhaust holes 13 may also serve to discharge reaction products. Further, in the present embodiment, the shower head 100 has an appearance of a circular plate shape conforming to the shape of the semiconductor wafer to be processed.

The processing chamber (processing vessel) 201 of the plasma etching apparatus 200 shown in FIG. 1 is formed in a cylindrical shape made of, e.g., aluminum of which surface is anodically oxidized. The processing chamber 201 is grounded. The mounting table 202 installed within the processing chamber 201 is configured to mount the semiconductor wafer as a processing target substrate thereon and the mounting table 202 serves as a lower electrode. The mounting table 202 is connected with a high frequency power application device such as a non-illustrated high frequency power supply.

Figure 3:
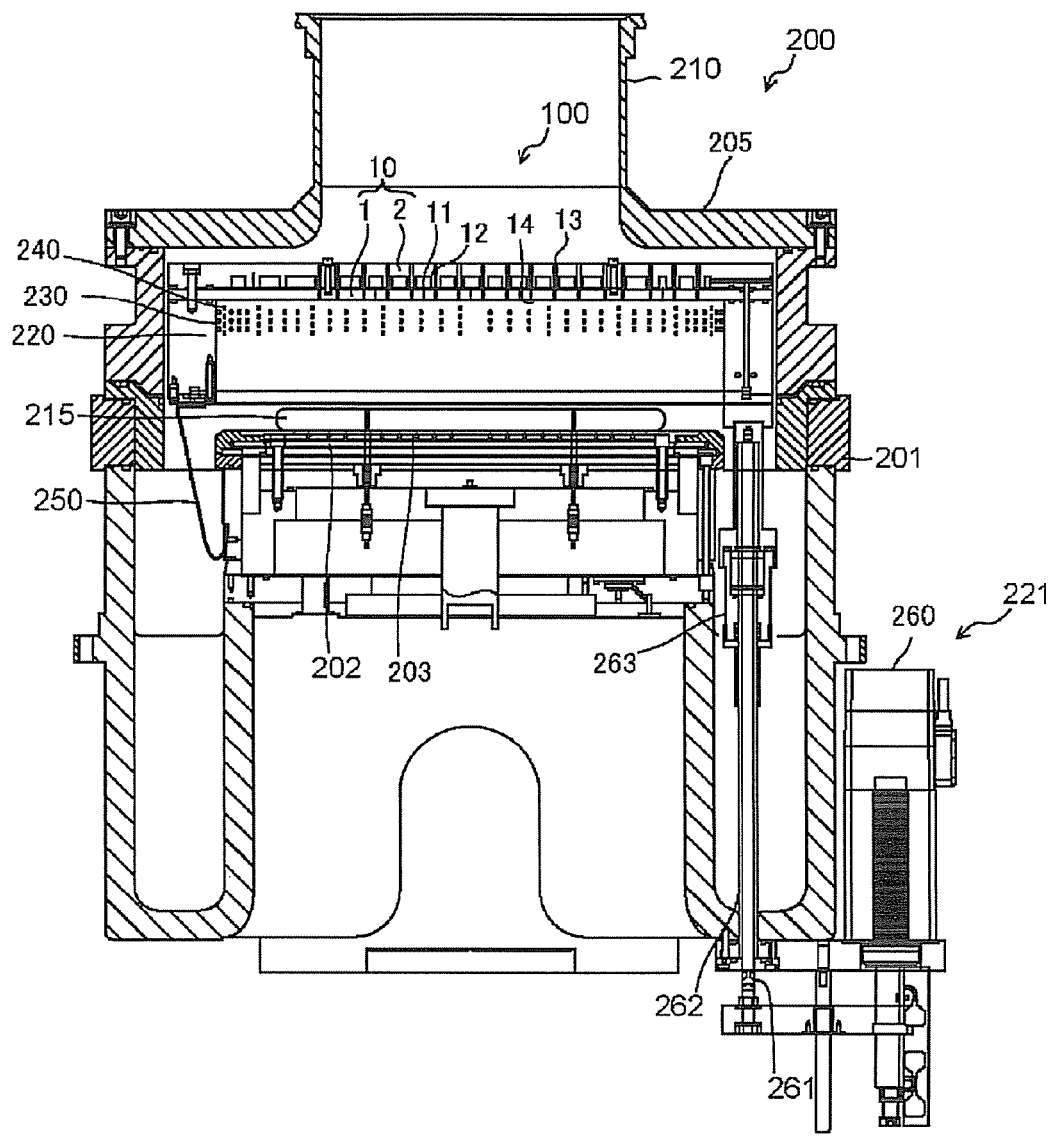
FIG. 3 is a longitudinal cross sectional view illustrating a state in which a shower head of the plasma processing apparatus is in a raised position.

An electrostatic chuck 203 that electrostatically attracts and holds the semiconductor wafer W thereon is provided on the mounting table 202. The electrostatic chuck 203 includes an electrode embedded in an insulator. The semiconductor wafer is electrostatically attracted and held by a Columbic force generated by a DC voltage applied to this electrode. Further, the mounting table 202 is provided with a flow path (not shown) through which a temperature control medium is circulated, and, thus, a temperature of the semiconductor wafer attracted to and held on the electrostatic chuck 203 can be regulated to a preset temperature. Furthermore, as illustrated in FIG. 3, provided in a sidewall of the processing chamber 201 is an opening 215 through which the semiconductor wafer is loaded into or unloaded from the processing chamber 201.

The shower head 100 illustrated in FIG. 2 is positioned above the mounting table 202 to face the mounting table 202 at a preset distance. The shower head 100 serving as the upper electrode and the mounting table 202 serving as the lower electrode form a pair of facing electrodes. A processing gas (etching gas) is supplied into the gas flow path 12 of the shower head 100 from a non-illustrated gas supply source.

Further, provided above the shower head 100 is a cover body 205 that airtightly seals a top opening of the processing chamber 201 while serving as a ceiling of the processing chamber 201. A cylindrical gas exhaust pipe 210 is provided in a central portion of the cover body 205, and a vacuum pump (not shown) such as a turbo molecular pump is connected to the gas exhaust pipe 210 via an opening/closing control valve, an opening/closing mechanism, and so forth.

A ring-shaped member 220 of a circular shape (cylindrical shape) is installed on a bottom surface of the shower head 100 so as to protrude downward along the circumference of the shower head 100. By way of example, the ring-shaped member 220 is made of aluminum coated with an insulating film (anodically oxidized film or the like) and is fixed to and electrically connected with the shower head 100 serving as the upper electrode.

The ring-shaped member 220 is connected with an elevating mechanism 221 and is configured to be movable up and down together with the shower head 100. An inner diameter of the ring-shaped member 220 is set to be slightly larger than an outer diameter of the mounting table 202, and the ring-shaped member 220 can be lowered to a position where its lower part surrounds the mounting table 202. FIG. 1 shows a state in which the ring-shaped member 220 and the shower head 100 are in a lowered position. When the ring-shaped member 220 and the shower head 100 are in the lowered position, a processing space 220 surrounded by the mounting table (lower electrode) 202, the shower head (upper electrode) 100 and the ring-shaped member 220 is formed above the mounting table 202. In this way, by forming the processing space 222 by the vertically movable ring-shaped member 220, it is possible to form the processing space 220 only in a region directly above the mounting table 202. Thus, formation of an unnecessary space extending outward from a periphery of the mounting table 202 in a horizontal direction can be suppressed.

Meanwhile, FIG. 3 illustrates a state in which the ring-shaped member 220 and the shower head 100 are in a raised position. In this raised position, the opening 215 through which the semiconductor wafer is loaded into or unloaded from the processing chamber 201 is opened, and loading and unloading of the semiconductor wafer into and from the processing chamber 201 is performed in this state. When the ring-shaped member 220 and the shower head 100 are in the lowered position, this opening 215 is closed by the ring-shaped member 220, as illustrated in FIG. 1.

As a driving source for the elevating mechanism 221, an electric cylinder 260 is used in the present embodiment. Here, a multi-axis driving mechanism in which a plurality of elevating mechanisms 221 is installed along the circumference of the processing chamber 201 at a same distance is used. By employing the multi-axis driving mechanism including the electric cylinder 260, positions of the ring-shaped member 220 and the shower head 100 can be controlled with high accuracy as compared to a case of using a pneumatic driving mechanism. Further, cooperative control for this multi-axis driving mechanism can be easily carried out electrically.

As shown in FIG. 1, a driving shaft of the electric cylinder 260 is connected with an elevating shaft 261, and the elevating shaft 261 is installed to be inserted into a cylindrical fixed shaft 262 that is uprightly extended from a bottom portion of the processing chamber 201 toward an upper side of the processing chamber 201. A driving part of the elevating shaft 261 is airtightly sealed by, e.g., double O-rings or the like in a sealing member 263.

In the present embodiment, the shower head 100 is positioned, in a depressurized atmosphere, inside the cover body 205 that airtightly closes the top opening of the processing chamber 201. A pressure difference between the depressurized atmosphere and an atmospheric atmosphere is not applied to the shower head 100 but is applied only to the elevating shaft 261. Accordingly, the shower head 100 can be moved up and down easily with a small driving force, so that energy consumption can be reduced. Furthermore, since a mechanical strength for the driving mechanism can be decreased, apparatus manufacturing cost can be reduced.

The ring-shaped member 220 is provided with a plurality of gas exhaust holes 230 and a multitude of gas supply holes 240 opened in its inner surface. In the present embodiment, sets of three gas exhaust holes 230 are uniformly formed along the circumference of the ring-shaped member 220 at a preset distance, and the three gas exhaust holes 230 in each set are vertically arranged in a straight line. Further, sets of four gas supply holes 240 are uniformly formed along the circumference of the ring-shaped member 220 at a predetermined distance, and the four gas supply holes 240 in each set are vertically arranged in a straight line. Here, the numbers of the gas exhaust holes 230 and the gas supply holes 240 are not limited to the mentioned examples.

The gas exhaust holes 230 are configured to evacuate the inside of the processing space 222, and they communicate with a non-illustrated gas exhaust path formed within the ring-shaped member 220 along the circumference thereof. The shape of the gas exhaust holes 230 is not limited to a circular shape, but they may have, e.g., an elliptic shape. The gas exhaust holes 230 may also serve to discharge reaction products.

The gas supply holes 240 are configured to supply the processing gas into the processing space 222 from the non-illustrated gas supply source. The gas supply holes 240 communicate with a non-illustrated processing gas flow path formed within the ring-shaped member 220 along the circumference thereof. Further, the gas supply holes 240 may be formed in a substantially horizontal direction to supply the processing gas in a horizontal direction or they may be formed at a preset inclination angle with respect to a horizontal direction so as to supply the processing gas from the upside toward the downside, i.e., toward a surface of the substrate, for example.

Figure 4:
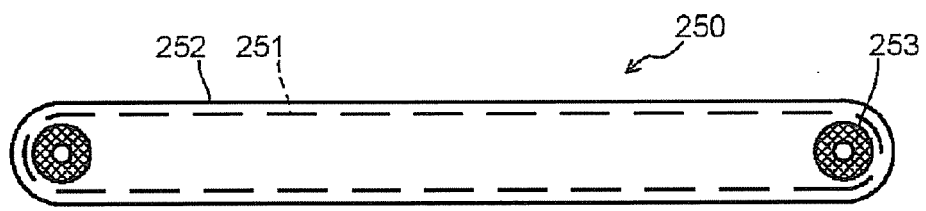
FIG. 4 is a top view illustrating a sheet cable of the plasma processing apparatus of FIG. 1.

A plurality of sheet cables 250 is installed between the ring-shaped member 220 and a ground side of a high frequency line under the mounting table 202 to connect them electrically. The sheet cables 250 are arranged at a same distance along the circumference of the ring-shaped member 220. As illustrated in FIG. 4, each sheet cable 250 is made of a sheet-shaped conductor 251 made of copper and coated with an insulating layer 252, and a connecting part 253 at which the conductor is exposed and which is provided with a through hole for screwing is formed at each of both ends of the sheet cable 250. The sheet cable 250 has a thickness of, e.g., several hundreds of microns and is flexible so that it can be transformed as the ring-shaped member 220 and the shower head 100 are moved up and down.

Figure 5:
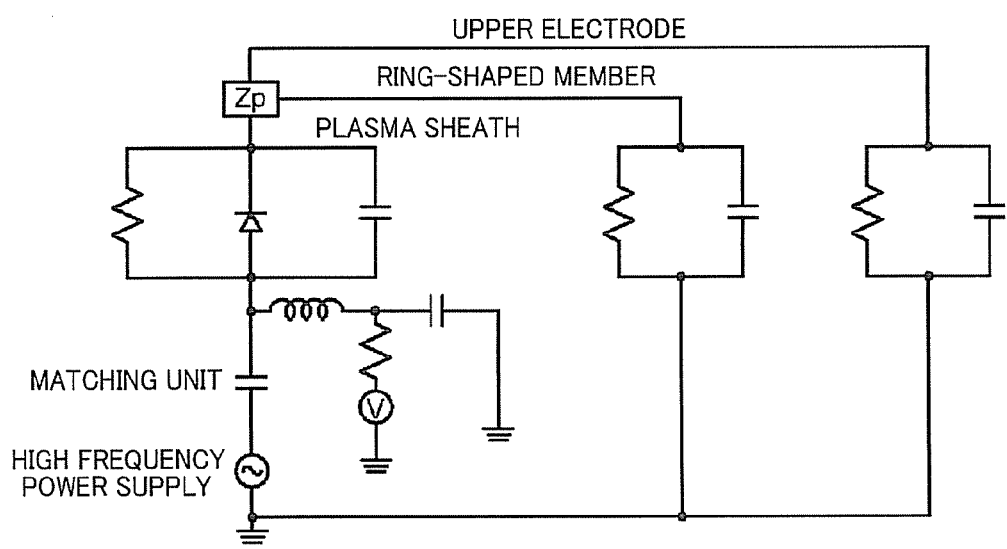
FIG. 5 is a diagram illustrating an equivalent circuit of the plasma processing apparatus of FIG. 1.

The sheet cables 250 are provided for returning high frequency waves of the ring-shaped member 220 and the shower head 100 serving as the upper electrode. An equivalent circuit of the plasma processing apparatus is illustrated in FIG. 5. As shown in FIG. 5, the shower head 100 serving as the upper electrode and the ring-shaped member 220 are electrically connected with each other and are electrically connected with the ground side of the high frequency line.

As stated above, in the present embodiment, the ring-shaped member 220 and the shower head 100 serving as the upper electrode are electrically connected with the ground side of the high frequency line by the sheet cable 250 in a short path, not by a processing chamber wall. Accordingly, potential differences between respective components due to plasma can be suppressed.

Moreover, the ring-shaped member 220 and the shower head 100 serving as the upper electrode are configured to be vertically movable, while they are electrically connected with the ground side of the high frequency line, so that they are not in an electrically floating state.

As discussed above, since the plasma etching apparatus 200 has the vertically movable ring-shaped member 220, the processing space 222 can be formed only in a region directly above the mounting table 202. Accordingly, formation of an unnecessary space extending outward in a horizontal direction can be suppressed. Thus, consumption of the processing gas can be reduced. Furthermore, since the supply and the exhaust of the gas is performed through the ring-shaped member 220, the state of the processing gas within the processing space 222 can be more accurately controlled, and, thus, uniform processing can be carried out. Besides, the distance between the shower head 100 as the upper electrode and the mounting table 202 can be varied depending on processing conditions or the like.

In addition, although the opening 215 for loading and unloading the semiconductor wafer into/from the processing chamber 201 makes an asymmetric shape, the processing space 222 has a physically symmetric shape, and, thus, plasma can be prevented from being affected by such an asymmetric shape. Therefore, more uniform processing can be carried out.

In order to perform a plasma etching on a semiconductor wafer by using the plasma etching apparatus 200 having the above-described configuration, the opening 215 is opened by elevating the ring-shaped member 220 and the shower head 100, as illustrated in FIG. 3. In this state, the semiconductor wafer is loaded into the processing chamber 201 through the opening 215 and is electrostatically attracted to and held on the electrostatic chuck 203 to be mounted on the electrostatic chuck 203.

Subsequently, the opening 215 is closed by lowering the ring-shaped member 220 and the shower head 100, and, thus, the processing space 222 is formed above the semiconductor wafer. Then, the processing space 222 within the processing chamber 201 is evacuated to a preset vacuum level by a vacuum pump or the like through the gas exhaust holes 13 and 230.

Thereafter, a processing gas (etching gas) is supplied from a non-illustrated gas supply source. The processing gas is then supplied toward the semiconductor wafer on the mounting table 202 from the gas discharge holes 11 via the gas flow path 12 of the shower head 100 in a shower pattern. Concurrently, a processing gas (etching gas) is supplied toward the semiconductor wafer on the mounting table 202 from the gas supply holes 240 at a certain flow rate.

Then, an internal pressure of the processing chamber 201 is maintained at a preset pressure, and then a high frequency power of a preset frequency such as about 13.56 MHz, is applied to the mounting table 202. As a result, a high frequency electric field is generated between the shower head 100 serving as the upper electrode and the mounting table 202 serving as the lower electrode, and the etching gas is dissociated and excited into plasma. Then, the etching process is performed on the semiconductor wafer by the plasma.

In the etching process as described above, the processing gases supplied from the gas discharge holes 11 of the shower head 100 and the gas supply holes 240 of the ring-shaped member 220 are exhausted through the gas exhaust holes 13 distributed in the shower head 100 and through the gas exhaust holes 230 provided in the ring-shaped member 220. Accordingly, unlike in a case of exhausting the gas through a lower portion of the processing chamber 201, a gas does not flow from a central portion of the semiconductor wafer toward a peripheral portion thereof. Thus, the processing gas can be more uniformly supplied to the semiconductor wafer. As a result, since plasma can be generated uniformly, uniform etching can be performed on each area of the semiconductor wafer. That is, process uniformity in the wafer surface can be improved.

Upon the completion of the plasma etching process, the application of the high frequency power and the supply of the processing gas are stopped, and the semiconductor wafer is unloaded from the processing chamber 201 in the reverse order to that described above.

As discussed above, since the processing gas is supplied and exhausted from the shower head 100 and the ring-shaped member 220 in the plasma etching apparatus 200 in accordance with the present embodiment, the processing gas can be more uniformly supplied to the semiconductor wafer. Accordingly, uniform etching process can be performed on each area of the semiconductor wafer.

Moreover, in the plasma etching apparatus 200 as described above, since the gas is exhausted through the gas exhaust holes 13 of the shower head 100 and the gas exhaust holes 230 of the ring-shaped member 220, a gas exhaust path need not be provided in the vicinity of the mounting table 202 or the shower head 100, unlike in conventional cases. Therefore, a diameter of the processing chamber 201 can be made similar to an outer diameter of the semiconductor wafer as a processing target substrate, so that the size of the apparatus can be reduced. Furthermore, since the vacuum pump is installed above the processing chamber 201 and the gas is exhausted from a region closer to the processing space of the processing chamber 201, gas exhaust can be carried out efficiently. Further, since two gas exhaust systems are provided, a capacity of an individual vacuum pump can be reduced, and, thus, the size of the apparatus can be further reduced.

In addition, since the distance between the shower head (upper electrode) 100 and the mounting table (lower electrode) 202 can be varied depending on a process and the shower head 100 can be moved up and down by a small driving force, energy consumption and apparatus manufacturing cost can be reduced.

Moreover, the present disclosure is not limited to the above-stated embodiments but can be modified in various ways. By way of example, although the above-described embodiment has been described for the case of applying a high frequency power of a single frequency to the mounting table (lower electrode), the present disclosure may also be applicable to a plasma etching apparatus that applies multiple powers of different high frequencies to a lower electrode.

What is claimed is:
1. A plasma processing apparatus comprising:
a lower electrode installed within a processing chamber and serving as a mounting table that mounts a substrate thereon;
an upper electrode that is installed within the processing chamber so as to face the lower electrode and is vertically movable so as to vary a distance between the upper electrode and the lower electrode, the upper electrode serving as a shower head for supplying a gas toward the substrate in a shower pattern through a plurality of gas supply holes provided in a facing surface of the upper electrode facing the lower electrode;
a cover body installed above the upper electrode so as to air tightly seal a top opening of the processing chamber, thereby preventing air from passing through a top portion of the processing chamber;
a multiple number of gas exhaust holes provided in the facing surface;
a ring-shaped member that is protruded downward and arranged along a circumference of the upper electrode, is vertically movable along with the upper electrode, and forms, at a lowered position, a processing space surrounded by the lower electrode, the upper electrode and the ring-shaped member, the ring-shaped member being fixed to the upper electrode;
a multiplicity of gas supply holes opened in an inner wall of the ring-shaped member to supply a gas into the processing space; and
a plurality of gas exhaust holes opened in the inner wall of the ring-shaped member to evacuate the processing space,
wherein the plurality of gas exhaust holes and the multiplicity of gas supply holes are interspersed in the inner wall of the ring-shaped member, and
wherein, at the lowered position, the inner wall of the ring-shaped member which extends downward from the upper electrode, is positioned close to an outer sidewall of the lower electrode, such that the processing space is formed only in a region directly above the lower electrode, at least a part of the gas supply holes of the ring-shaped member is formed to have a preset inclination angle with respect to the facing surface, an elevating shaft is directly under and connected with a bottom of the ring-shaped member, and the elevating shaft is inserted into a cylindrical fixed shaft that is uprightly extended from a bottom portion of the processing chamber toward an upper portion of the processing chamber, the elevating shaft being installed to penetrate a bottom wall of the processing chamber, and the upper electrode and the ring-shaped member are vertically moved by vertically moving the elevating shaft using an electric cylinder installed outside of the processing chamber.

2. The plasma processing apparatus of claim 1, further comprising:

an openable/closable opening that is provided in a sidewall of the processing chamber and is positioned between the lower electrode and the upper electrode to allow loading and unloading of the substrate into/from the processing chamber, wherein the loading and unloading of the substrate is performed when the ring-shaped member is in a raised position.

3. The plasma processing apparatus of claim 1, wherein the ring-shaped member is made of aluminum coated with an insulating film.

4. The plasma processing apparatus of claim 1, wherein the ring-shaped member is electrically connected with the upper electrode, and the ring-shaped member is connected with a ground potential by a flexible sheet cable made of a metal sheet of which surface is coated with an insulating layer.

5. The plasma processing apparatus of claim 1, wherein the ring-shaped member and the upper electrode are moved up and down by a multi-axis driving mechanism using the electric cylinder.

* * * * *